United States Patent [19]
Houldsworth et al.

[11] Patent Number: 5,093,985
[45] Date of Patent: Mar. 10, 1992

[54] METHOD OF ASSEMBLY FOR SMALL ELECTRICAL DEVICES

[76] Inventors: John Houldsworth, 1555 Autmn Ridge Cir., Reston, Va. 22094; Anthony P. Duck, 1115 N. Vernon St., Arlington, Va. 22201

[21] Appl. No.: 373,288

[22] Filed: Jun. 30, 1989

[51] Int. Cl.$^5$ .................. H05K 3/36; H01H 11/00
[52] U.S. Cl. ............................... 29/830; 29/622; 439/61; 439/493; 445/123
[58] Field of Search ............ 29/830, 622; 445/23; 174/117 F, 117 FF; 350/336; 439/61, 67, 77, 493

[56] References Cited

U.S. PATENT DOCUMENTS

| | | | |
|---|---|---|---|
| 4,219,928 | 9/1980 | Kuo . | |
| 4,241,371 | 12/1980 | Sage | 362/61 |
| 4,283,593 | 8/1981 | Piasecki et al. . | |
| 4,296,489 | 10/1981 | Mitsui | 368/205 |
| 4,380,357 | 4/1983 | Evans et al. | 339/17 CF |
| 4,464,832 | 8/1984 | Asick et al. | 29/839 |
| 4,465,378 | 8/1984 | Maurer et al. | 368/88 |
| 4,540,907 | 9/1985 | Hagenlocher et al. | 310/68 |
| 4,588,456 | 5/1986 | Dery et al. | 156/52 |
| 4,642,421 | 2/1987 | Dery et al. | 174/88 R |
| 4,659,872 | 4/1987 | Dery et al. | 174/117 A |
| 4,676,854 | 6/1987 | Suzuki et al. | 156/151 |
| 4,795,895 | 1/1989 | Hara et al. | 235/492 |
| 4,801,768 | 1/1989 | Sugiyama et al. | 200/5 A |
| 4,812,135 | 3/1989 | Smith | 439/493 |
| 4,838,798 | 6/1989 | Evans et al. | 439/61 |
| 4,928,206 | 5/1990 | Porter et al. . | |
| 4,931,598 | 6/1990 | Calhoun et al. | 174/117 F |
| 4,942,364 | 7/1990 | Nishijima et al. | 324/696 |
| 4,964,693 | 10/1990 | Branan et al. | 350/96.29 |
| 4,964,700 | 10/1990 | Takabayashi | 350/336 |

FOREIGN PATENT DOCUMENTS 0197516  4/1985  European Pat. Off. .
0247893  5/1986  European Pat. Off. .

OTHER PUBLICATIONS

"Anisotropic Conductive Layers, Nippon Graphite Industries, Ltd.", Promotional Sales Literature.
"Anisotropic Adhesives: Screen Printed Electronic Assembly", Site Magazine, Ken Gilleo.
"Display/Driver Interconnections Using Conductive Hot Adhesives", by Reinke and Kennedy.
"High Volume Manufacturing of Three Dimensional Molded Circuit Board Products", by Frisch et al.
"Designing Tools and Fixtures for Molded Circuits and Three Dimensional Devices", by Frisch et al.
"Selectively Conductive Molded Devices From Pathtek", sales literature from Pathtek.
"Three Dimensional Molded Interconnects for Document Sensing", by Ramansky et al., Pathtek.
"Pathtek 3-D Molded Device Facility Ready For Production", sales literature from Pathtek.
"3-D Circuitry Enhances Injection Molded Boards", ICI Americas, Inc., Reprint from Electronics Product Magazine (8/1/85).
"Victrex For Molded Circuit Boards", sales literature from Imperial Chemical Industries, PLC (1985).
"Molded Circuit Boards Compete for High Volume Markets", reprint, Electronics Packaging and Production (6/86).
"Printed Circuit Fabrication, Injection Molded Thermal Plastic Boards", reprint, Circuit Fabrication, vol. 9, No. 7 (7/86).
"ICI Electronics Group, 3-D Molded Circuit Boards", sales literature from ICI Americas, Inc. (1987).
"Hewlett Packard Custom LED Display Solutions", sales literature from Hewlett Packard.
"Elite", sales literature from Elite, a Dupont Company.
"Engineering Design with Dupont Polymers".

*Primary Examiner*—Carl E. Hall
*Attorney, Agent, or Firm*—Mary Helen Sears; Stephen Glazier

[57] ABSTRACT

A method of assembly for small electrical devices which enhances automated assembly opportunities while reducing costly and nonuniform hand operations, by including the use of flexible connectors, anisotropic adhesives, three dimensional molded circuit boards and elastomeric connectors.

7 Claims, 11 Drawing Sheets

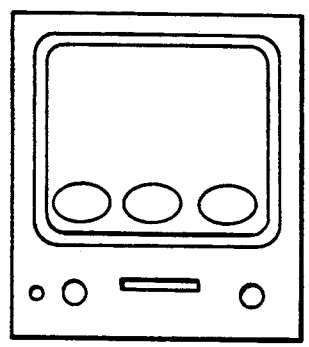
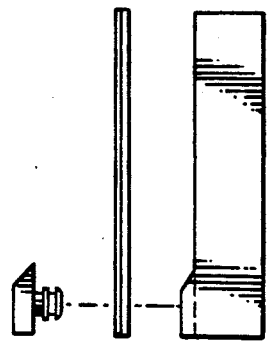
Fig. 13      Fig. 14
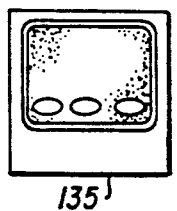 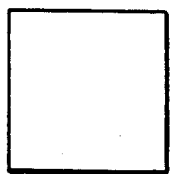 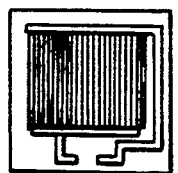 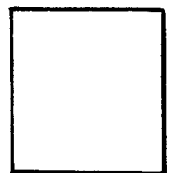
135      140      150      160
Fig. 15
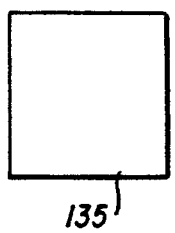 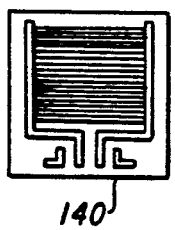 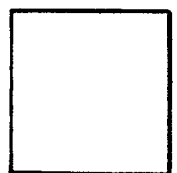 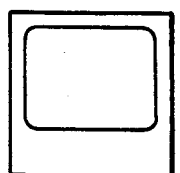
135      140      150      160
Fig. 16

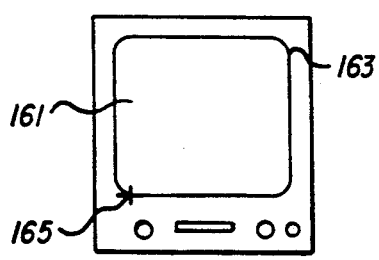
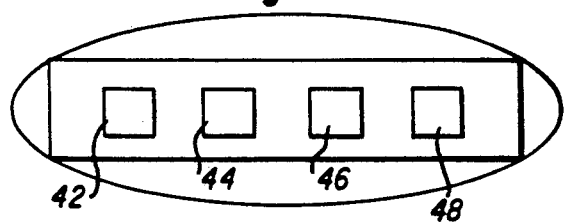
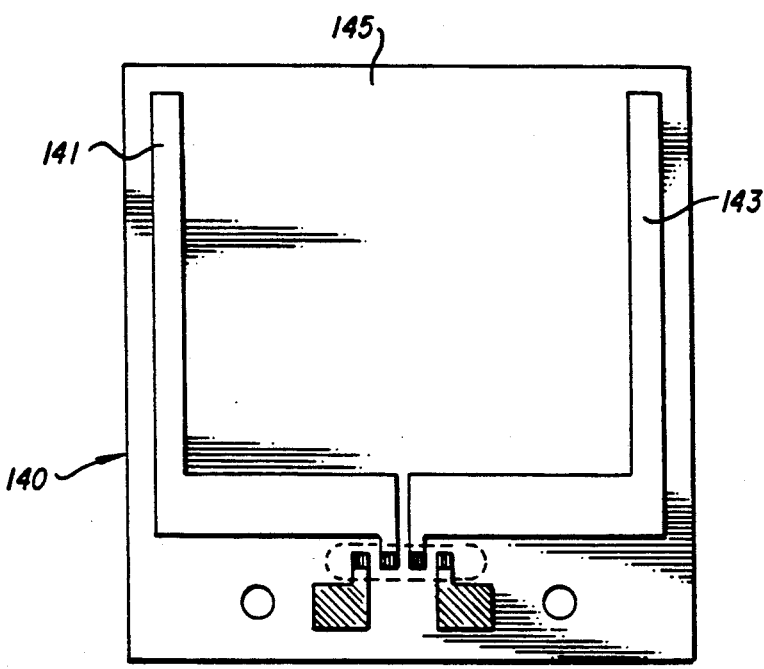
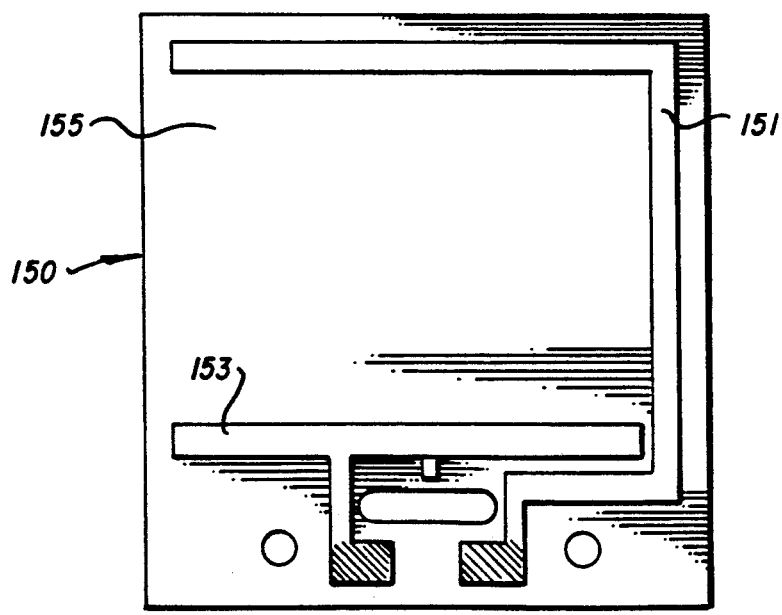

METHOD OF ASSEMBLY FOR SMALL ELECTRICAL DEVICES

FIELD OF THE INVENTION

The present invention pertains to an improved and far more efficient method of assembling an electrical device. More particularly, the invention provides a method of assembly which enables enhanced efficiency, production volume and uniformity in assembling small electrical devices, by reducing hand assembly operations, reducing connection points, increasing ease of connection and interconnection of mixed technology printed circuit boards, and reducing the number of parts and part sizes required. In a preferred mode, the invention relates especially to the assembly of electrical devices equipped with touch sensitive screens, and especially to temperature control devices that are so equipped.

BACKGROUND OF THE INVENTION

Over the years, with the advent of electronics and later computers, hundreds of electrical devices have been developed. With the ability to assemble sophisticated and complex electrical devices has come emphasis on reduction in size, ease of assembly, reduction in number of component parts and total cost reduction. Because of the development of microprocessors and microcomputers, it has become possible to assemble smaller, and more compact electrical devices. Although these devices use different families of parts, circuits and components, assembly of these electrical devices is effected by the interconnection of the electrical circuitry, generally mounted onto flat, substantially two-dimensional circuit boards using printed wiring assemblies with attached components to carry, control, select, store and manipulate the electronics signals as required for each device. Although manual insertion and soldering is a popular approach for joining electrical and electronic components to circuit boards, it is a labor intensive procedure with an inherent propensity for non-uniformities, and at times, inaccuracies.

At the location of the interconnections of the components, circuit boards and wiring assemblies, the greatest potential for system failure exists. Because of the size, tolerance requirements and relative position associated with the attachment of the electrical components to conventional circuit boards, usually printed circuit boards (PCBs), and electrical circuit interconnection of the PCBs, much of this assembly is performed by hand. For attachment of an electrical component to a PCB, components leads are inserted through holes that are tooled into the PCB and the component leads are then usually either wave soldered or hand soldered to the PCB, rigidly attaching the component into position.

Prior to this invention, this procedure remained substantially the same for interconnection of the PCB electrical circuits, for example, if a ribbon connector or an edge connector was used, it had to be attached to each PCB in the same manner used for attachment of a component. PCB interconnection usually involved hand soldering of connectors, ribbons or pins, which was especially true for the display and mother boards.

Many practical difficulties are associated with the assembly of these small electrical devices. Assembly required some degree of expensive, non-uniform hand work; the hand soldering techniques typically were performed at individual assembler stations where the soldering procedure was repeated numerous times depending on the number of interconnection points required. The soldering points present sites for system failure due to insufficient or improper attachment; reduction in the number of soldering points reduces failure locale. Moreover, due to the cost of labor, the soldering operations and their number substantially affected the cost of the units produced. In addition, although surface mount technology was available, it could not be utilized to its fullest potential because connector attachment typically required soldering of the leads.

Conventional connectors are not conducive to assembly by automation because:

a. Connector to PCB assembly often requires dedicated equipment;

b. Soldering may have to be manual because of the relative position of the connectors on the PCBs;

c. Through hole connectors may reduce the ability to exploit surface mount component assembly;

d. The mechanical assembly of PCBs with rigid pins and sockets is not easily automated;

e. Externally applied clips and/or brackets are necessary to hold PCBs together; and, f. All PCBs must be supported to avoid mechanical stress of the electrical connection system.

For the assembly of small electrical devices, problem areas include: the number of interconnection and the type of interconnection; and, the number of PCBs and components, and their size and space requirements. Depending on the intended function of the electrical device, whether it includes computer software, and its application, the electrical components, attached at different locations on the circuit boards, are of different sizes, and may be numerous. Reduction in PCB, component and connector types, sizes and numbers, is beneficial. For example, although surface mounting of components is available using pick and place machines, because of the through-board requirements of many of the connectors, this type of automation has not been fully exploited.

In addition to electrical interconnection of the circuits, in the prior art, the PCBs had to be structurally mounted to prevent displacement and breakage which would cause error and failure in the electrical device. This assembly step also was labor intensive and did not lend itself to automation.

Moreover, for small electrical devices with industrial process applications, usually operator interface is necessary. For these devices, the desired operator interface with the process system is achieved by using a combined mother/display board and an operator input device such as a switch. This type of interface, using a combined mother/display board has specific soldering problems in that the solder joints need to be made on both sides of the PCB because of the interface requirements. However, conventional wave soldering techniques are only compatible with through-hole component attachment on one side of the PCB. Therefore, attachment of components on the second side of the PCB is by hand soldering. To solve this problem, flexi-rigid PCBs are used. The flexi-rigid PCB is a PCB of varying thicknesses which combines mother/display board needs by having, for example, two thick portions and one thin portion in one PCB such that the thick portions can be folded over at the thin part of the PCB, effectively creating components on both sides. (Mother boards are circuit boards that interconnect PCBs, e.g., other PCBs may be plugged into a mother board.) However, flexi-rigid PCBs are expensive to manufacture because of their varying thicknesses, and do not provide for interconnection of mixed technology PCBs.

For the small electrical devices used for process applications, the switch was often a membrane switch. These dual layer switches, which are fixed key position switches, typically opaque, must be connected to the mother/display board (which is also referred to herein as a display board or display PCB). Interconnection normally was effected by an flexible integral tail which was a connector ribbon, from one or both of the two layers of the membrane switch, having the conductive traces from the switch extended thereon. The tail or connector ribbon was then connected to the mother/display board by metal pins which were crimped, inserted or soldered, or by plugging the tail into a socket mounted onto the mother/display board. However, the tail was a flimsy structure and its position difficult to predict, so this assembly step was not easily automated.

Although there were some piecemeal attempts to address some of the problems associated with the assembly of small electrical devices, as discussed, many problem areas still existed.

SUMMARY AND ADVANTAGES OF THE INVENTION

In the present invention there is shown a method of assembly for a small electrical device which substantially reduces hand assembly requirements, and facilitates automated assembly, improves functional density of the product, significantly decreases material cost and substantially reduces total cost of production. For joining electrical and electronic components to circuit boards, and for electrical circuit interconnection, use of flexible connectors, polymer bonding such as anisotropic adhesive, elastomeric connectors, and three dimensional molded circuit boards (MCBs) substantially improves assembly methods while creating a superior quality device.

By comprehensively addressing the individual problems associated with assembly of small electrical devices, the present invention provides solutions to a wide range of problems. An object of the invention is to provide a low cost, automatable method of interconnection and packaging using a new and improved combination which includes three dimensional molded circuit boards (MCBs), flexible connectors, anisotropic adhesives and/or elastomeric connectors and which may include conventional PCBs. The invention depends on engineering technology applied and combined in a unique manner with a resultant integral assembly that streamlines costs of production, reduces size requirements, and increases reliability of hardware thereby providing a unique and highly adaptable solution to the problems associated with the assembly of small electrical devices. By minimizing the circuitry and wiring necessary for assembly, there is a reduction in the number of soldering points in the electrical circuitry which correspondingly reduces the number of failure and fatigue locations. Access for repair and replacement is increased because the size and number of the parts is reduced. Foremost, automation is facilitated because of the reduction in hand operations.

The invention provides both indirect an direct benefits such as:

a. Dual function of parts, thereby reducing part requirements and their associated assembly costs (including labor and fixtures);
b. Reduction in size requirements;
c. Reduction in inspection operations;
d. Increasing reliability and repeatability; and,
e. Minimized field failure opportunities.

The present invention provides for exploitation of surface mounting technology which can be automated, for example, by the use of pick and place machines. The reduction in tooling and the reduction in the number of leads for connectors favorably impacts assembly requirements.

As an improvement over the use of conventional PCBs, three dimensional molded circuit boards (MCBs) can be used as an effective substitute. MCBs are a combination of circuitry, wiring, hardware and physical structure integrated into a one-piece consolidation. They can be used for either the straight forward replacement of single- and double-sided conventional PCBs with two dimensional profiles (i.e., relatively little use of three dimensional content), or they may incorporate intricate mechanical interlocking features which permit transmission of electrical signals, voltage or ground pathways between mating products. This design capability enables the interconnection of devices or components having minimal to no solder assembly requirements.

In addition to the innate ability of plastics to offer three-dimensionality in a substrate, their high resistivity, high humidity and temperature tolerance, flame retardancy and good mechanical properties all contribute to their versatility in product applications.

Uniquely shaped holes of uniform configuration and placement are easily included in molded boards, and tapered lead-ins facilitate parts insertion. Creation of composite constructions that integrate mechanical/structural features with electrical functions provides a unique performance attribute as well as economic benefits that result in a competitive market advantage because while the MCB and its conventional equivalent are functionally identical, the MCB offers advantages of weight reduction and overall assembly cost savings.

MCBs offer many advantages compared with conventional PCBs including molded-in holes which are of superior quality and eliminate the need for drilling; improvements in component placement because surface mount components can be placed in locating pockets; reduction in machining and soldering operations; and ready achievement of high density circuitry.

In addition to molded circuit boards, the use of anisotropic adhesives for interconnection of parts is a preferred mode of the present invention. The anisotropic layer is a connecting film having three simultaneous functions, i.e., adhesion, conduction and insulation, after bonding.

A film made of anisotropic materials behaves as a dielectric in its own plane (x, y axes), while it conducts vertically (z axis) if a component or other planar-conductive surface is applied to the adhesive's surface under pressure. Because of this unique property, these new materials can be used to connect components, non-solderable elements, and flexible connectors to circuits boards and electrical circuits to other electrical circuits; these new materials permit connection of connectors without soldering.

Anisotropic adhesives offer convenience as well excellent bonding capabilities. They also offer the capability of connecting difficult-to-solder substrates and components, including glass. Because anisotropic adhesive do not require exacting tolerances for good bonding, they readily lend themselves to automation techniques.

Another feature employed in this invention which enhances the ability to automate and reduces assembly time for small electrical devices is the use of elastomeric connectors. Because of recent improvements in reliability and repeatability of the quality of elastomeric connectors, elastomeric connectors are gaining increased acceptance for use for connection of electronic and electrical components. Because no permanent contacts are made, assembly and disassembly is facilitated. These connectors are low in comparative cost to the expense of soldered and socketed connections and elastomeric connectors are optimumly used where large numbers of closely spaced contact pads are to be connected with a high degree of reliability. Not only do elastomeric connectors facilitate automatic assembly, they also avoid the need for tails on membrane switches and touch switches by providing the connection from the mother/display board to the switch.

The invention provides for the mix and match of printed circuit boards having different component mounting technologies. For example, for an embodiment of the present invention, the technology is split, that is, the mother/display board uses chip on board, another PCB uses surface mount technology with reflow soldering and a third PCB combines through hole and surface mount technology.

In addition, if a family of small electrical devices is manufactured, this mix and match feature can be used to reduce the number of different parts needed for the entire family, that is, because each subassembly does not necessarily have to be unique for each device, a particular circuit board may be used for more than one device within a family, thereby reducing the total number of subassembly parts.

For example, in a preferred practice of the present invention, a number of the component attachments and electrical interconnections are used to assemble a temperature controller so that hand operations and assembly steps are minimized while apparatus reliability is increased. For an industrial single loop control application such as temperature control, for the assembly of a small electrical device, the prior art used conventional PCBs, to which various electrical components, such as resistors, capacitors, and integrated circuits were attached, for the control, display, power supply and keyboard hardware. The temperature controller had a front panel for display and operator interface through the keyboard. It received remote electrical signals for processing and response through terminals located at the rear. It typically was provided with a protective housing sleeve to prevent damage caused by various environmental factors, which was attached to the front panel. However, using the preferred mode of the present invention, because molded circuit boards can function both structurally and electrically, they can be substituted electrically for the conventional printed circuit boards and structurally for the frame and protective housing; the molded circuit board can be designed to replace both the printed circuit board, and the protective housing, obviating the need for a separate protective housing sleeve.

Ease of use is enhanced by incorporation of the touch switch, instead of the membrane switch. The touch switch, commonly called a touch sensitive screen, can have a deadfront appearance until operator/process interface is desired. It has been the practice of industry, with the operator/process interface, to present a fixed key configuration, using membrane switches, which is visible during normal operation. With the advent of touch screen technology, it is now possible to provide for the display/keyboard interface for which the keyboard is configured through the software on the touch sensitive screen, and which can be changed through a change in the software for the keyboard configuration without a mechanical change in the configuration of the keyboard; it can be effected by supervisory personnel, depending on the application sought. This display/keyboard can be key-configured, for example, to permit operator interface for selected functions only, or to contain a secret key location which is known to the supervisory personnel only.

Light emitting diodes (LEDs) or other types of indication can be placed behind the touch screen, so that information or functions can be illuminated, displayed and controlled.

Electrical interconnection between the touch screen and the display PCB is an additional step that can be automated and reduced to a single step, rather than the tedious process of connector soldering, by using an elastomeric connector which is held against both the contacts of the touch screen and the display PCB by two snapped-together plastic moldings. In this manner, there is no need for a tail on the touch screen, and there is no difficulty with the touch screen interconnection to the display PCB, that is, by the use of an elastomeric connector from the touch screen to the display PCB, the hand soldering of the tail from the touch screen to the display PCB is no longer necessary.

The present invention has substantial advantages over the use of flexi-rigid PCBs and other industry standards. It provides for: a reduction in cost; the use of different board technologies; and, modular assemblies. In particular, there is no hand soldering on the display PCB, and the use of surface mount technology can be fully exploited. The fold up design allows for a mechanically rigid design for added support while providing for stress relief.

The demand for reliable, easy to use miniature instrumentation in industrial process control application and automation has caused industry to focus on high density packaging, ease of assembly and reduction in component numbers and size. The present invention solves all of the above problems and provides an apparatus and means for assembly which substantially reduces assembler requirements, increases reliability through reduction of the number of parts and connection locations, combines connector functions with structural functions, thereby reducing size and connector requirements, and decreases assembly time due to dual function circuit boards.

Although the invention is illustrated and described in relationship to specific embodiments, it is nevertheless not intended to be limited to the details shown, since various modifications and structural changes may be made therein within the scope and range of equivalents of the claims and without departing from the spirit of the invention.

The features which are considered characteristic of the invention are set forth more fully in the detailed description and in the appended claims. These advantages will be apparent from the following description, reference being had to the accompanying drawings, wherein a preferred embodiment of the present invention is set forth in detail.

BRIEF DESCRIPTION OF THE DRAWINGS

In the drawings:

FIG. 13 is a front view of a graphic overlay for a single loop controller.

FIG. 14 is a side view of the subassembly routine for the front panel of a single loop controller.

FIG. 15 shows the front of each of four layers comprising a graphic overlay for a single loop controller.

FIG. 16 shows the back of each of four layers comprising a graphic overlay for a single loop controller.

FIG. 17 is a rear view of a graphic overlay for a single loop controller.

FIG. 18 is an exploded view of the connection pads of a graphic overlay for a single loop controller.

FIG. 19 is an exploded back view of the top panel of a touch screen switch of a graphic overlay for a single loop controller.

FIG. 20 is an exploded front view of the bottom panel of a touch screen switch of a graphic overlay for a single loop controller.

DETAILED DESCRIPTION OF THE INVENTION

Figure 1:
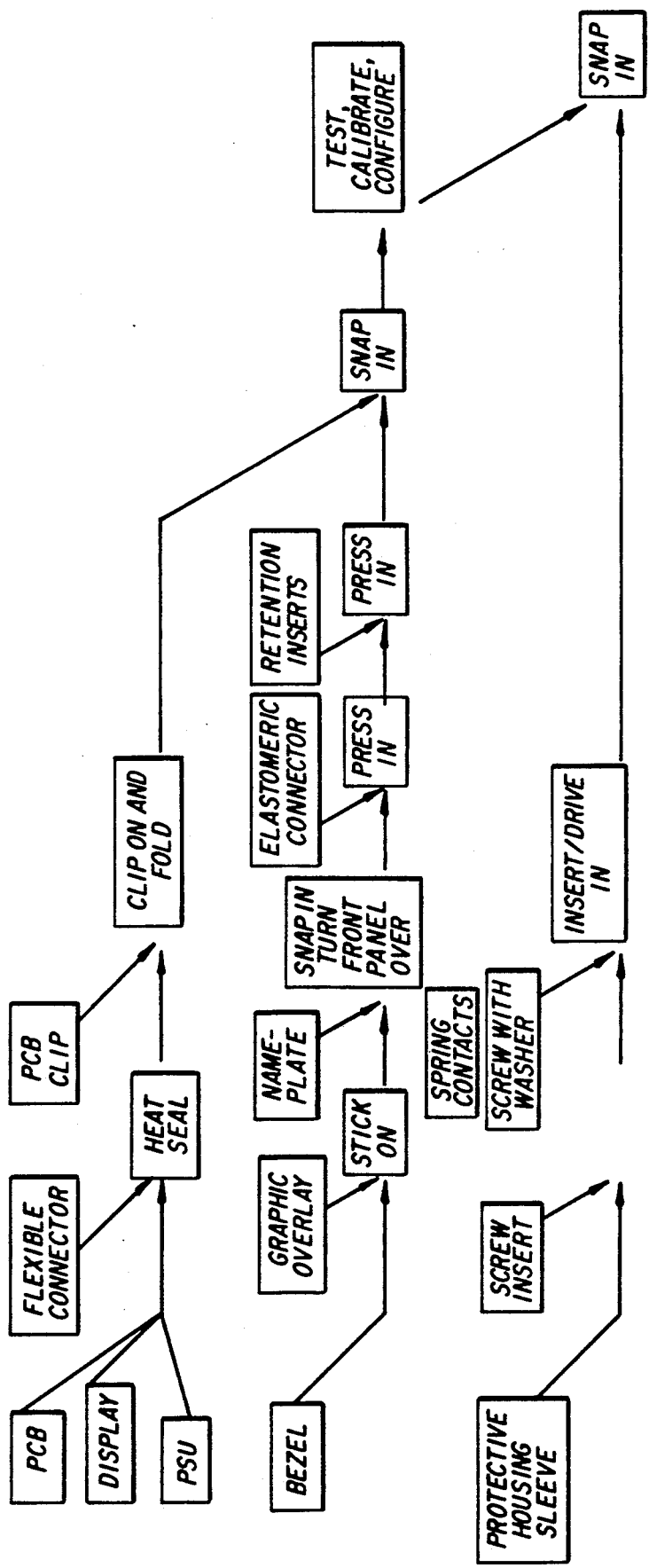
FIG. 1 is a flow chart showing the assembly sequence for a single loop controller.

Referring to the drawings, in FIG. 1 is shown a flow sheet for assembly of single loop temperature controller which is preferred mode for assembly of a small electrical device. The major parts which comprise the temperature controller are preassembled and the method of assembly for the present invention is not dependent on their subassembly. The circuit boards, either printed circuit boards or molded circuit boards, or a combination of both, are first interconnected both structurally and electrically, using a heat sealed anisotropic adhesive, to a flexible connector. So that the display circuit board can be easily connected electrically to the touch screen switch, which is part of the front panel, the display printed circuit board is locked into a piece of molded plastic, called a printed circuit board clip. The printed circuit board clip with interlocked display printed circuit board then is locked into the front panel, with the elastomeric connector held in a fixed position between the display and touch screen by the printed circuit board clip and the bezel. The front panel is assembled separately and is comprised of the bezel 105, graphic overlay 103, nameplate 102 and various other parts. Finally, the entire intermediate assembly is placed into a protective housing sleeve, which is also subassembled separately. The protective housing sleeve connects to the terminal contacts for input and output for the temperature controller.

Figure 2:
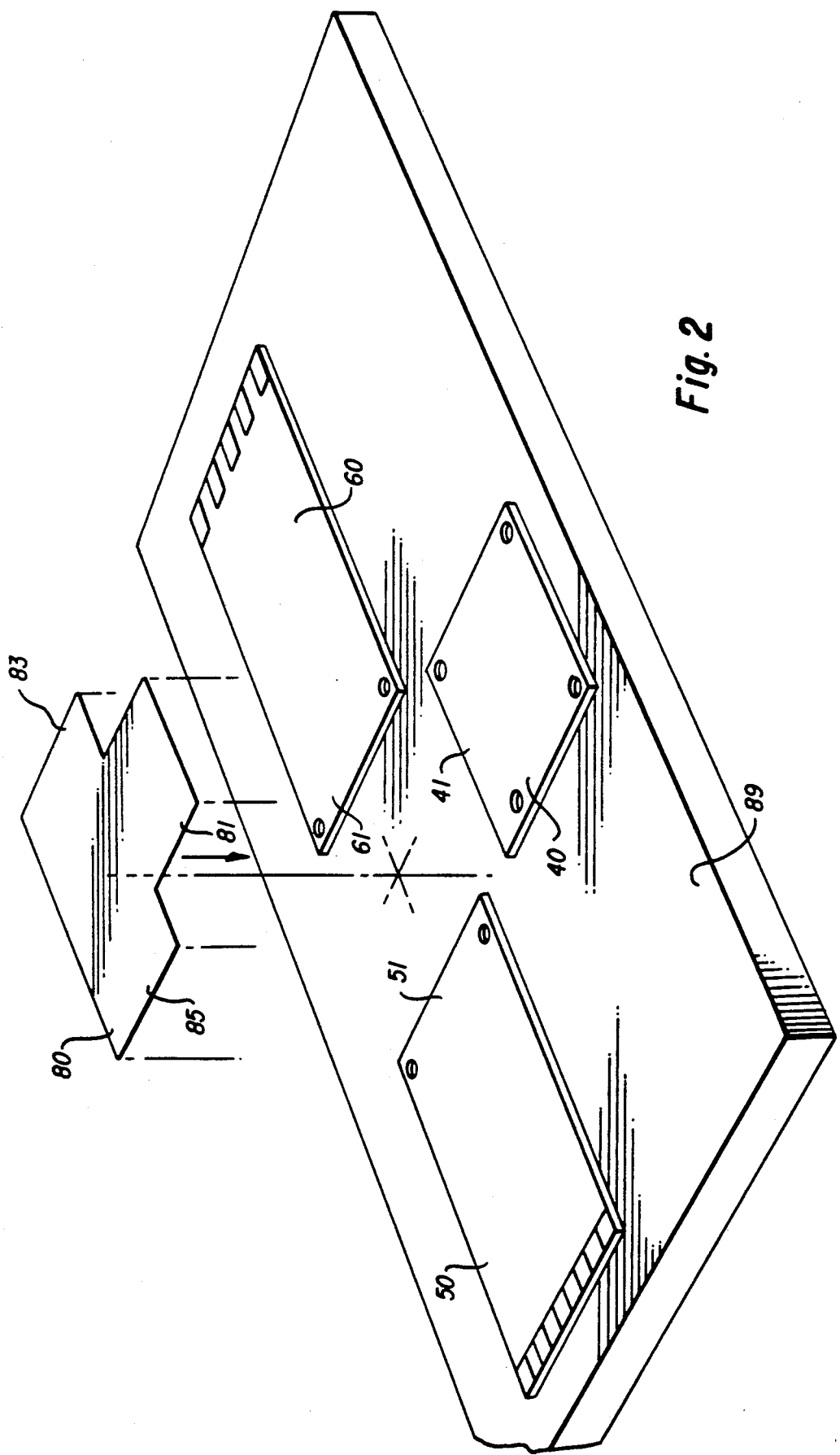
FIG. 2 is a perspective view of the first assembly phase arrangement of several of the major parts for a single loop controller.
Figure 3:
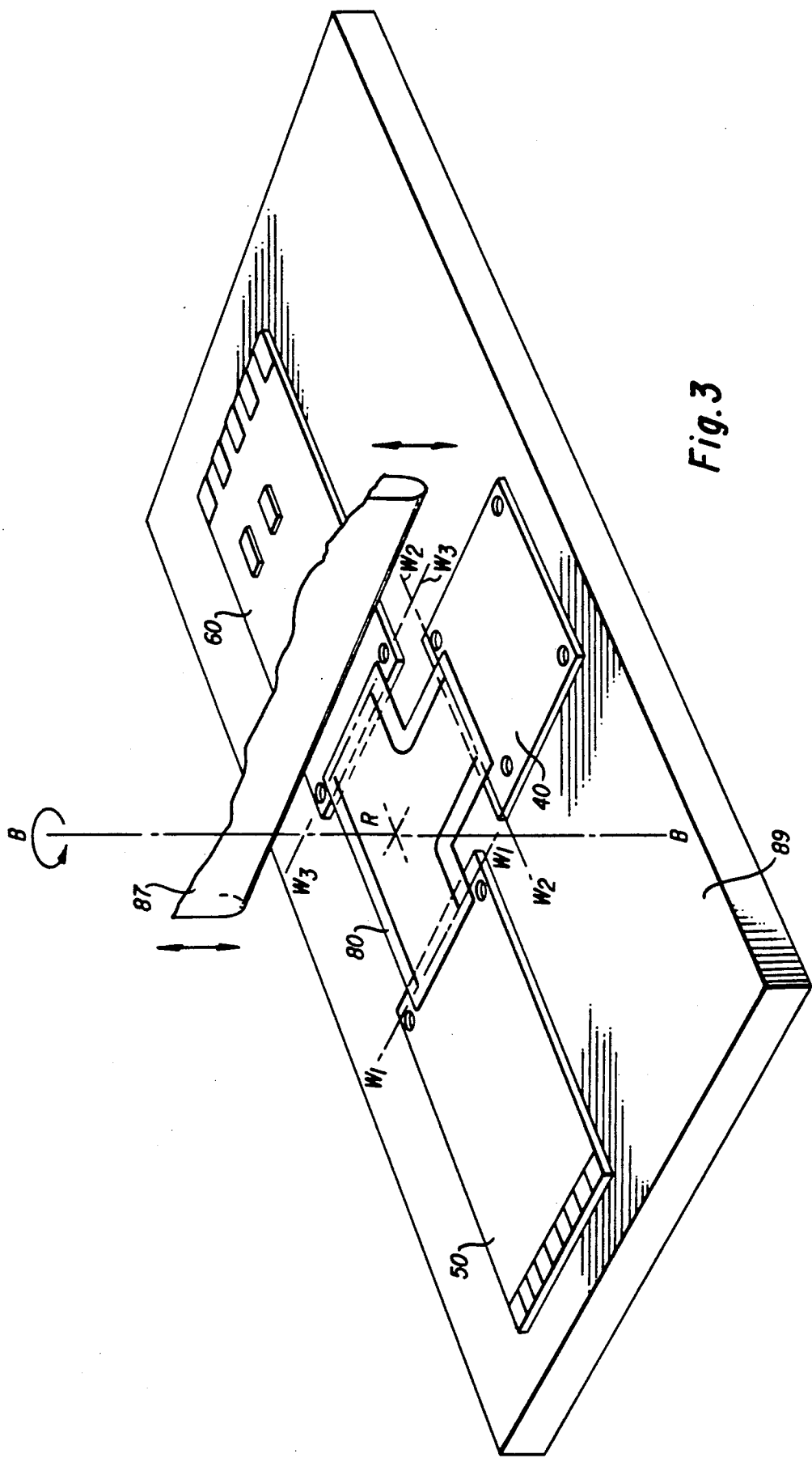
FIG. 3 is a perspective view of the heat sealing phase of the assembly routine for a single loop controller.
Figure 12:
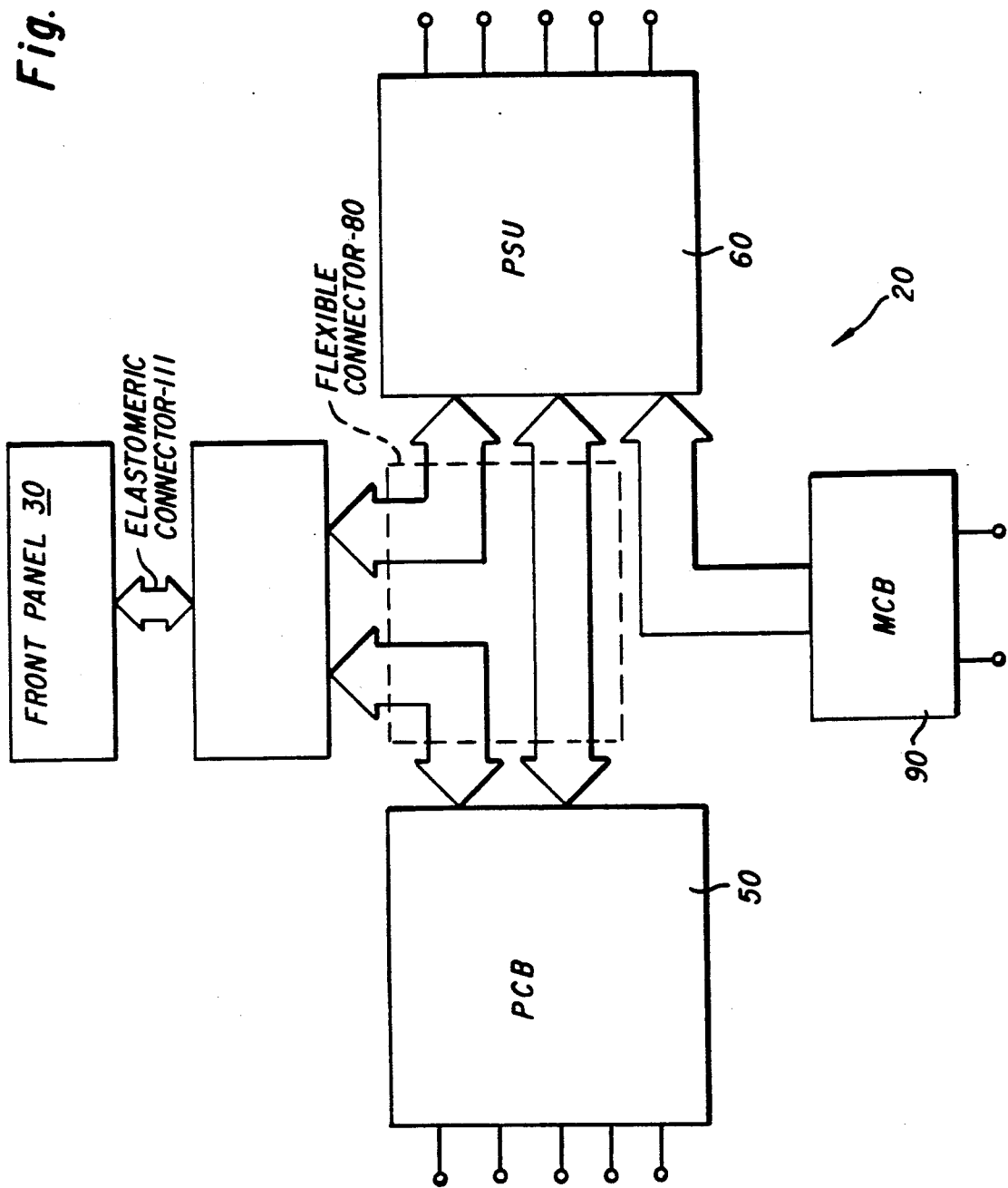
FIG. 12 is a schematic drawing in which the parts are represented by modules to demonstrate the electrical relationship of the parts.

In FIG. 12 is shown a conceptual block diagram of the electrical circuits. The single loop controller 20 is comprised of seven major subassembled components 30, 40, 50, 60, 70, 80, 90 and 111 designed for assembling into the hardware required. These subassembled components are further defined as front panel 30, a display PCB assembly ("display") 40, a measurement and control PCB ("PCB") 50, a power supply unit and output PCB ("PSU") 60, a flexible connector 80, a three dimensional molded circuit board ("MCB") 90, and an elastomeric connector 111. These parts, to which other components are attached, comprise the subassembled components for the single loop controller hardware. For the sake of clarity, the PCB 50 and the PSU 60 are shown in FIGS. 2 and 3 without their premounted, subassembled, component parts. The mode of assembly of the subassembled components 30, 40, 50, 60, 70, 80, 90 and 111 is hereafter referred to as the "assembly routine". This routine constitutes an embodiment of the present invention.

Figure 9:
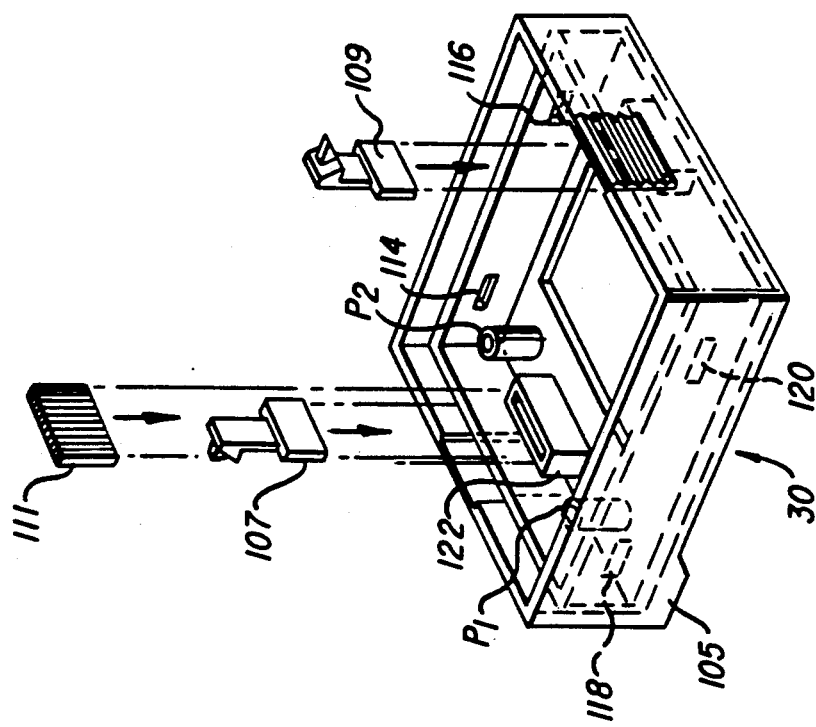
FIG. 9 is a perspective view of the subassembly routine for the inside of the front panel of a single loop controller.
Figure 10:
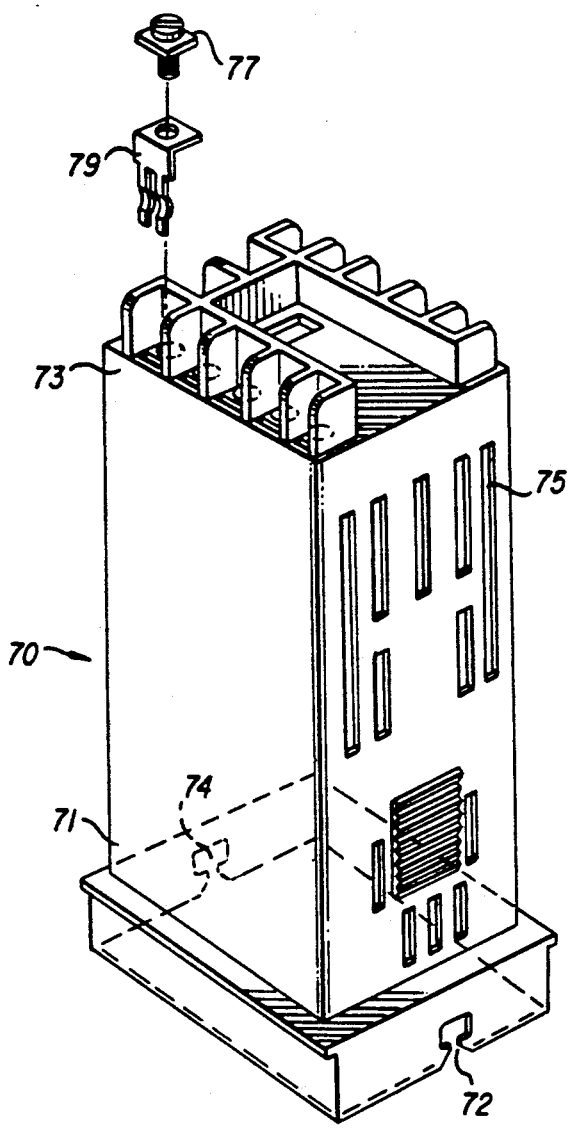
FIG. 10 is a perspective view of a protective housing sleeve for a single loop controller.

The subassembled components 30, 40, 50, 60, 70, 80, 90 and 111 are connected structurally and electrically in the manner shown in the drawings, FIGS. 2 through 9, and then the entire intermediate assembly 25, after attachment of front panel 30, is inserted into the protective housing sleeve 70, shown in FIG. 10.

Referring now to FIGS. 2 and 3, there is shown a perspective view of the initial step of the assembly routine for the single loop controller 20. Connection of the subassembled components 30, 40, 50, 60, 70, 80 and 90 proceeds by attaching the flexible connector 80 to the display 40, the PCB 50 and the PSU 60 by heat sealing using an anisotropic adhesive.

To form the anisotropic adhesive, conductive particles, such as silver or carbon fiber, are thoroughly dispersed in a liquid dielectric adhesive media that may be a resin solution, thermoplastic resin, or liquid crosslinkable resin. These adhesives, also known as anisotropic conducting systems, use a conductive graphite, carbon or metallic spheres embedded in the adhesive to provide z-axis conductivity. The particle-loading must be low enough to provide sufficient space between the conductors. Once the particles are wetted by the adhesive composition, they tend to stay separated. The high surface energy of the conductive particles combined with the strong surface tension of the liquid phase part of the composition prevents attraction between conductor particles. Since the conductor particles are small, shorting cannot occur unless many conductors come together to form an electrical bridge (along the x, y axes). Because the conductors do not tend to join in this manner, the anisotropic adhesive matrix prevents conduction in the plane of the adhesive, acting as a dielectric material. It has conductivity in the perpendicular (z axis) and serves as a dielectric in its own plane (the x, y axes), thus, having electrically anisotropic properties after it is heat sealed in place. However, to maintain selective conductivity, the size of the conductive particles relative to the thickness of the adhesive layer, and the particle uniformity (for good electrical conduction) are important factors. Anisotropic adhesives are an ideal bonding agent because the need for extremely precise alignment of the parts to be joined is obviated due to their selective conductivity property. Because the tolerances for alignment are great, alignment can be easily automated, and can be effected, for example, by use of tooling holes. As long as the components are not completely misaligned (wrong tabs over the wrong contact pads), conductivity is specific to the areas where components are placed. Typically, the conductor and adhesive blend can be applied to a release film for later use or screen printed directly onto a circuit board. Other anisotropic adhesives are sold as precoated film on a plastic release substrate for heat transfer to circuits.

Whether the anisotropic adhesive is transferred or screen printed, component assembly is similar. If the anisotropic adhesive is a thermoplastic adhesive, however, heat and pressure must be applied for a specific time interval. The screen-printable products offer advantages over the transfer films such as: lower cost (no secondary transfer process or carrier); simple selective application; and, better adhesion (since bonding is in the wet state).

The anisotropic adhesive, when thermoplastic and transferred as a film, can be attached, for example, by first bonding the anisotropic adhesive which is carried on a releasable carrier, to a circuit board using heat and pressure. This assembly is then cooled and the releasable carrier stripped away. To attach the components, a component is then pressed against the anisotropic film while applying heat. The adhesive component of the blend softens or melts, allowing the terminals of the component to make contact with the conductive particles by pressing the particles against the circuit pads. Heat is removed and the adhesive hardens, producing an electromechanical bond.

Figure 11:
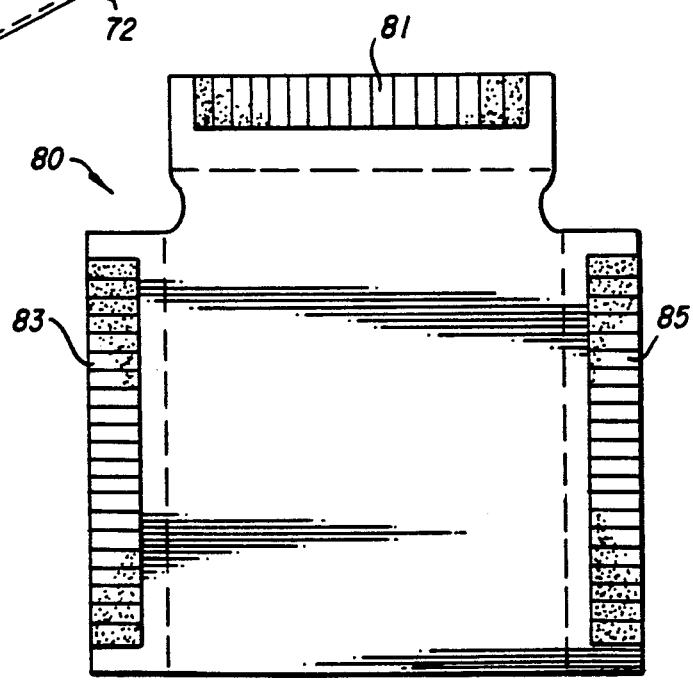
FIG. 11 is a top view of a flexible connector for a single loop controller.

For thin substrates such as a flexible connector, as shown in FIG. 11, heat can be applied through the flexible connector using a heated blade 87 on the assembly machine (not shown). Heat sealing machines useful for this purpose are Elform, Inc. model 150, or its equivalent, and are available commercially. In many cases, nominal force may be sufficient for bonds. Some processes do apply additional pressure and heating after the initial assembly is complete.

Another type of anisotropic adhesive uses a liquid thermoset adhesive blend and requires only printing, loading components and curing. The components are placed on the wet adhesive and settle down into the adhesive by themselves, coming to rest on the conductive particles. Still other anisotropic adhesives incorporate resins that shrink upon curing so that tensional forces are generated between the component terminal, the conductive particle, and the circuit board.

Use of fusible metals in the anisotropic matrix has been shown to improve performance for connections between flexible connectors and conventional circuit boards. Special metal alloys that readily bond to circuit conductors and components during the assembly process greatly increase mechanical strength and reliability. When fusible metals are combined with thermoset adhesives, very strong bonds can be achieved.

For connection of the flexible connector 80, the display 40, the PCB 50 and the PSU 60 are each nested on a base plate 89 such that the circuit boards of the PCB 50, PSU 60 and display 40 are coplanar and the contact areas 81, 83 and 85 of the flexible connector 80, shown in FIGS. 2 and 3, are positioned over the contact areas 41, 51, 61 of the display 40, the PCB 50 and the PSU 60. The relative positions of the contact areas 41, 51 and 61 to the contact areas 81, 83 and 85 is predetermined by the electrical circuits on the contact traces. The blade 87 of the heat sealing machine (not shown), which is temperature, pressure and time controlled, is then applied, at an elevated temperature and pressure, for a predetermined period, along the axis $W_1-W_1$ to the contact area 85 of the flexible connector 80 which overlays the contact area end 51 of the PCB 50. This heated depression by the blade 87 of the flexible connector 80 attaches the flexible connector 80 to the end of the PCB 50 both mechanically and electrically. Proper alignment and positioning of the heat seal is necessary and can be accomplished either optically or mechanically, for example by tooling hole alignment, and/or other features such as securing the flexible connector 80 into position using a vacuum hold down.

After attachment of the flexible connector 80 to the PCB 50, the jig (not shown) rotates the heat sealing blade 87 by 90° about point R on axis B—B. The mounting base plate 89 is realigned, either by hand or automatically, so that the heat sealing blade 87 is now positioned above the axis $W_2-W_2$ for heat seal connection by the above described process for another contact area 81 of the flexible connector 80 which overlays the contact area 41 of the display 40. This entire procedure is repeated for attachment along axis $W_3-W_3$ of the contact area 83 to the contact area 61 of the PSU 60.

Figure 4:
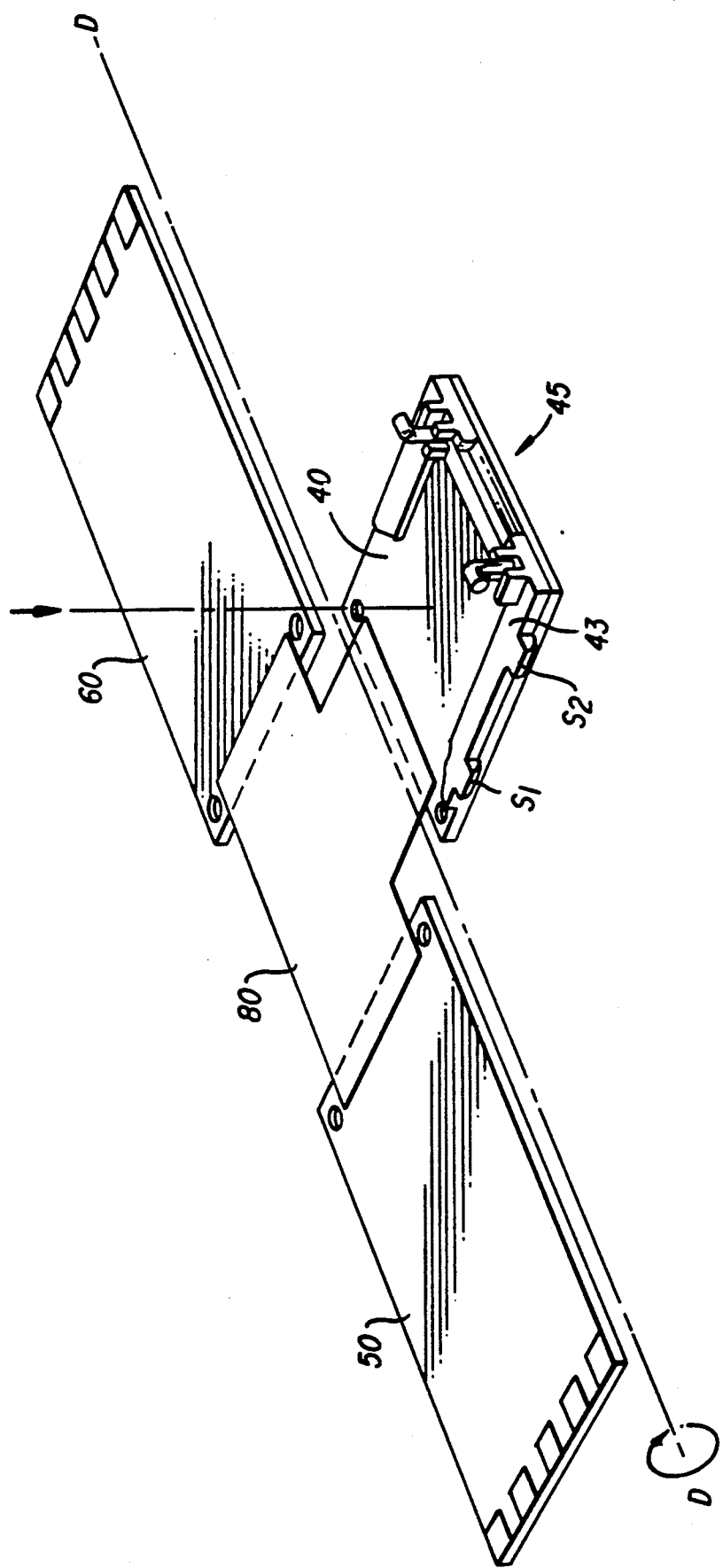
FIG. 4 is a perspective view of the printed circuit board clip attachment step of the assembly routine for a single loop controller.

In FIG. 4 there is shown the step of attachment of the display printed circuit board clip ("PCB clip") 43 which is the next phase of the assembly routine. The PCB clip 43 is attached by positioning the alignment pins (not shown) over the holes $H_1$ and $H_2$ (not shown) and pressing the PCB clip 43 down until the PCB snaps $S_1$ and $S_2$ lock the PCB clip 43 to the display 40, completing the display 40/PCB clip 43 assembly ("display assembly") 45. The completed attachment of the flexible connector 80, PCB 50 and PSU 60 is then rotated 180° in a clockwise direction about axis D—D so that the flexible connector 80 lies over the display assembly 45, as shown in FIG. 5.

Figure 5:
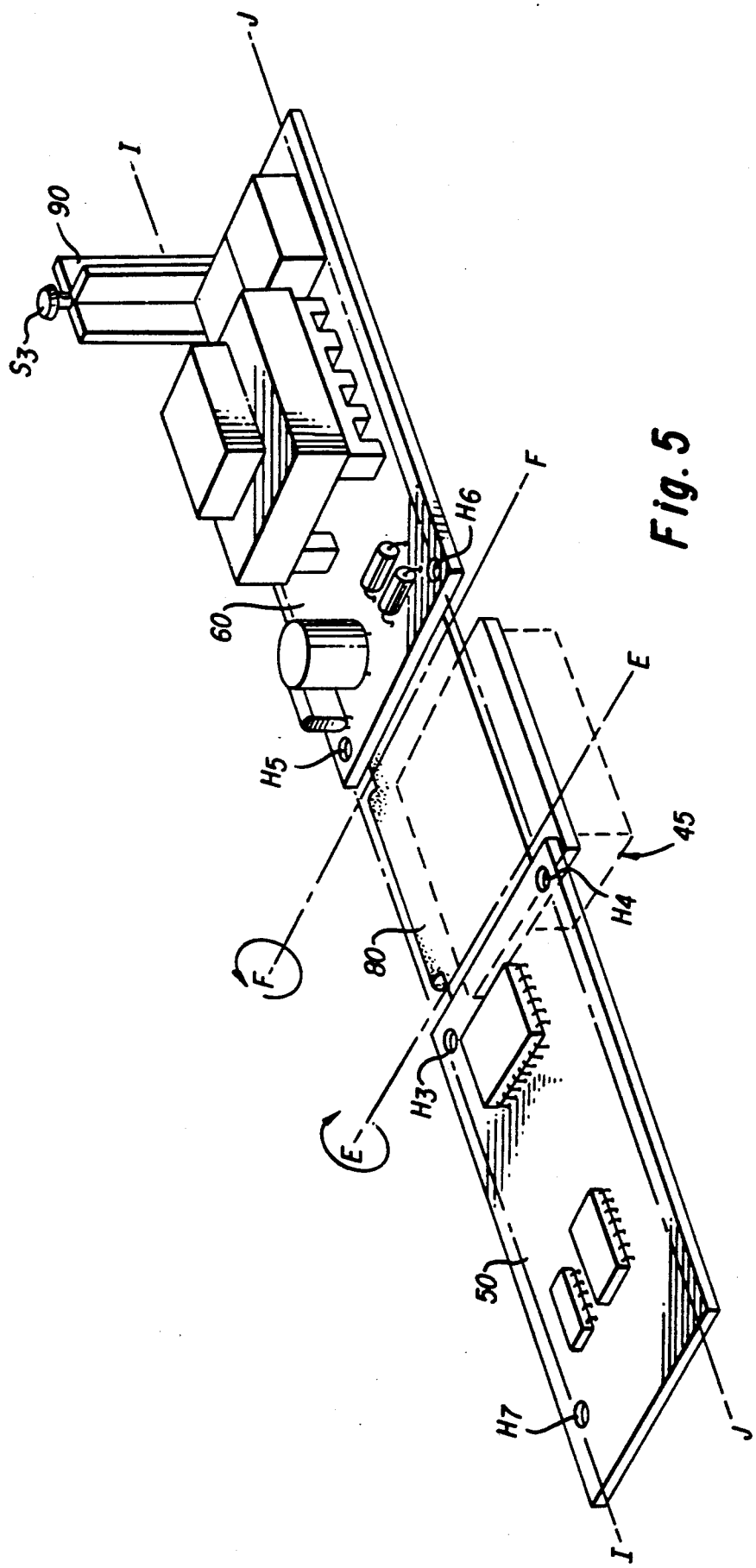
FIG. 5 is a perspective view of the final connection of the molded circuit board (MCB) assembly phase of the assembly routine for a single loop controller.

FIG. 5 shows the next step of the assembly routine. The holes $H_3$ and $H_4$ of the PCB 50, the holes $H_5$ and $H_6$ of the PSU 60 and the attachment pins (not shown) of the display assembly 45 are positioned along imaginary lines I—I and J—J. The PCB 50 and the PSU 60 are each then rotated 90°—the PCB 50 in a clockwise direction around axis F—F and the PSU 60 in a counter-clockwise direction around axis E—E, until each is vertical in a 90° angle orientation to the display assembly 45 and the assembly pins (not shown) of the display assembly 45 fit into the holes $H_3$, $H_4$, $H_5$ and $H_6$.

As previously described, anisotropic adhesive is used to connect one end of the three printed circuit boards to the flexible connector 80 which interconnects the electrical circuitry and components of the temperature controller. The printed circuit boards are then structurally and electrically interconnected by the use of at least one molded circuit board so that the connectors between the circuit boards are no longer necessary, and soldering interconnects are reduced. The circuit boards can be structurally interconnected by the use of, for example, snaps and pins. This interconnection is only possible due to the use of the fold up design and flexible connector. It would not be possible with a conventional PCB design arrangement along an X, Y plane.

Figure 6:
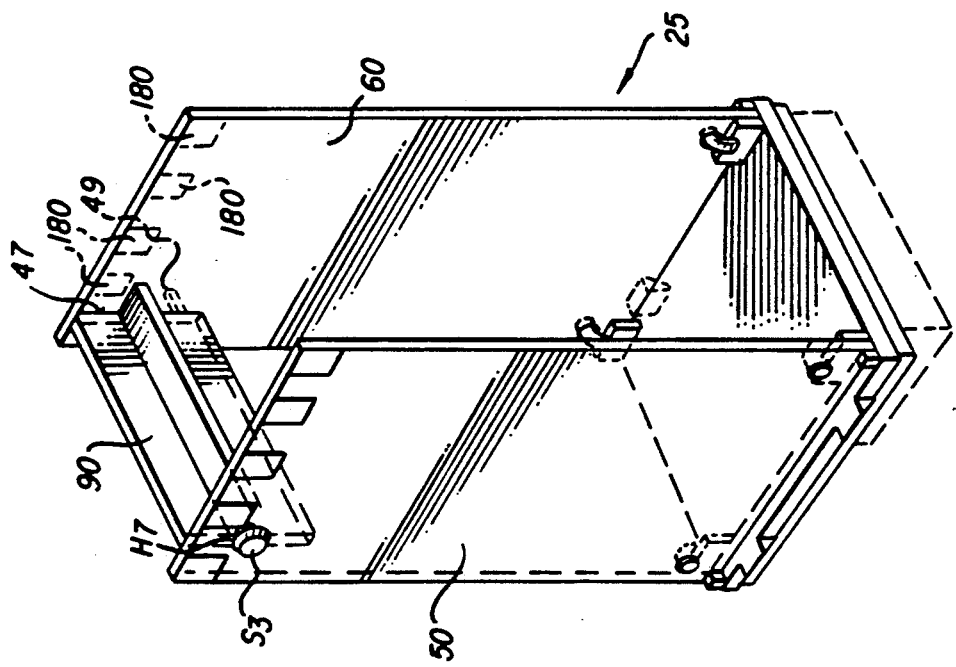
FIG. 6 is a perspective view, in a vertical orientation, of a substantially assembled single loop controller before attachment of the front panel and the protective housing sleeve.

Referring also to FIGS. 5 and 6, there is shown the connection of the MCB 90 which is a three dimensional molded circuit board that has been designed to connect both electrically and structurally to the PCB 50 and PSU 60 in order to stabilize and fix the circuit boards into position.

Molded Circuit Boards (MCBs) are made by injection molding of plastics and have conductive patterns selectively deposited on the surface(s). They can be molded in any shape providing that a method is available for applying the required circuit pattern.

The MCB 90 is subassembled by wave soldering the MCB 90 to the PSU 60 at only two points, that is, the electrical contact pin points 47 and 49. Upon rotation of the PSU 60, the snap $S_3$ of the MCB 90 then aligns and snaps into $H_7$ which is located on the PCB 50, completing the intermediate assembly 25 both structurally and electrically without the use of additional connectors.

In FIGS. 15 and 16 are shown the subassembly of the graphic overlay 103. The overlay is comprised of an antiglare filter/screen 135, the touch screen 130, and a backing called a bottom grey mask layer 160.

This resistive overlay technology involves an analog sensor which reports the x and y coordinates of a touch in its active area by measuring the change in voltage of the dual layer touch screen 130 which is comprised of two panels, which are thin layers of plastic material such as a polyester film, 140 and 150 that together act as a switch or switches. This is achieved with separate x and y layers that are coated with a resistive material. These layers come in contact only at points where sufficient touch pressure is applied. The touch screen 130 can be adapted, using filters, to mask and filter the light emitting diodes (LEDs) (not shown). Thus, the touch screen 130 provides both keyboard and display for the temperature controller. By insuring that the touch screen 130 remains disabled until touched in the software-configured key locations, it exhibits an unambiguous and uncluttered display under normal conditions.

The touch screen 130 can be made to conform to flat, curved or angled surfaces. Both isolated matrix and linear switches can be combined on the same panel. A form of touch screen used in this invention is available from C.A.M. Graphics Co., Inc., Amityville, N.Y. under the name of "Touchview" (Reg. Trademark).

Figure 8:
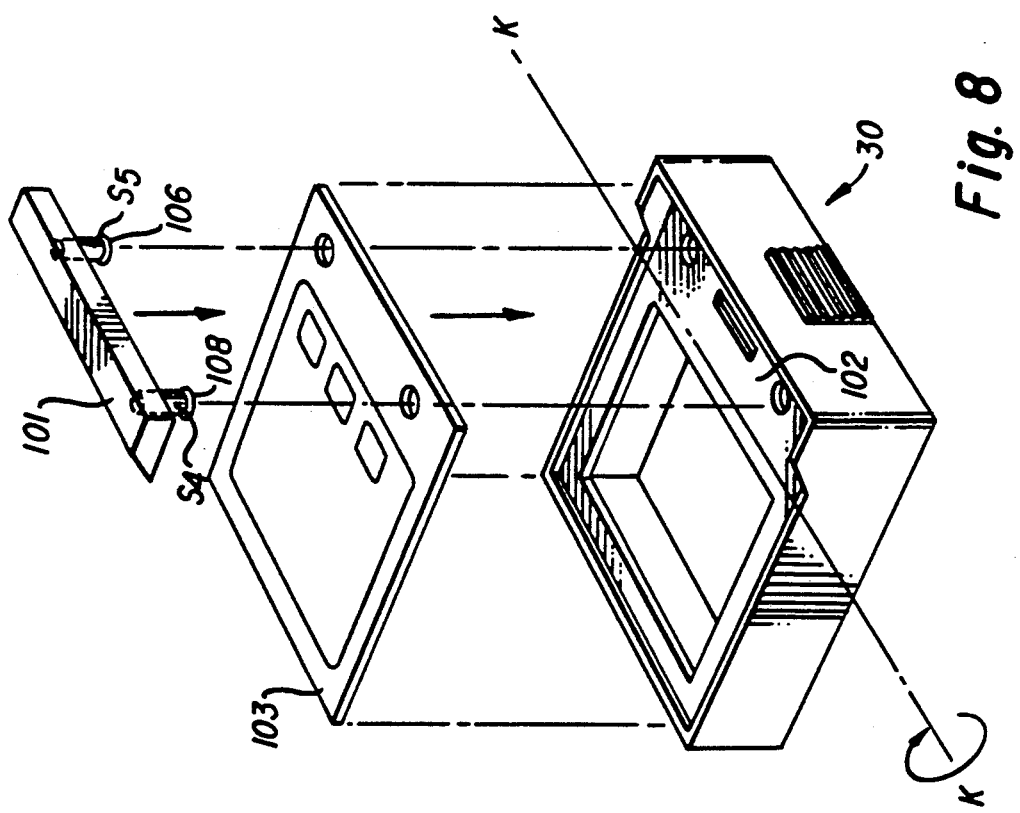
FIG. 8 is a perspective view of the subassembly routine for the front panel outside face of a single loop controller.

In FIGS. 8 and 9 are shown the steps for the subassembly routine for the front panel 30. This subassembly routine does not depend on the assembly of the intermediate assembly 25 and may be executed at a remote location for final attachment to the intermediate assembly 25. For the front panel 30, the graphic overlay 103 is adhesively attached to the bezel 105. The nameplate 101 then further secures the graphic overlay 103 to the bezel 105 with snaps $S_4$ and $S_5$ having ends 106 and 108 that snap through and over the top of pillars $P_1$ and $P_2$ to lock the nameplate 101 to the bezel 105. The front panel 30 is then rotated 180° about axis K—K. In FIG. 9 is shown the attachment of the retention lugs 107 and 109, which attach the completed front panel 30 to the protective housing sleeve 70 and the elastomeric connector 111.

Typically, these elastomeric connectors are made of alternating parallel layers of electrically conductive and nonconductive material such as silicon elastomer which provide redundant contacts for the component pads. The conductive layer is filled with metal or graphite particles. Interconnection is made by clamping of the substrates to be connected, that is, by mechanically holding the elastomeric connector against both of the circuit boards or other components to which electrical interconnection is sought, so that the electrically conductive layers of the connector are touching the contact pads of the circuit boards or other components and the electrical circuit is completed. Precise alignment is not required because the layers of the elastomeric connector are spaced more closely than the contact pads. In this way, at least one conductive layer is touching a contact pad, with at least one nonconductive layer between each pad. One elastomeric connector which can be used in the present invention is the Silver Stax elastomeric connector manufactured by PCK Elastomerics, Inc.

For the purposes of this application, the elastomeric connector 111 is defined as having alternating parallel layers of electrically conductive and nonconductive elastomeric material, while a flexible connector is defined as a thin substrate, such as polymer membrane, having the electrical circuits printed thereon.

Figure 7:
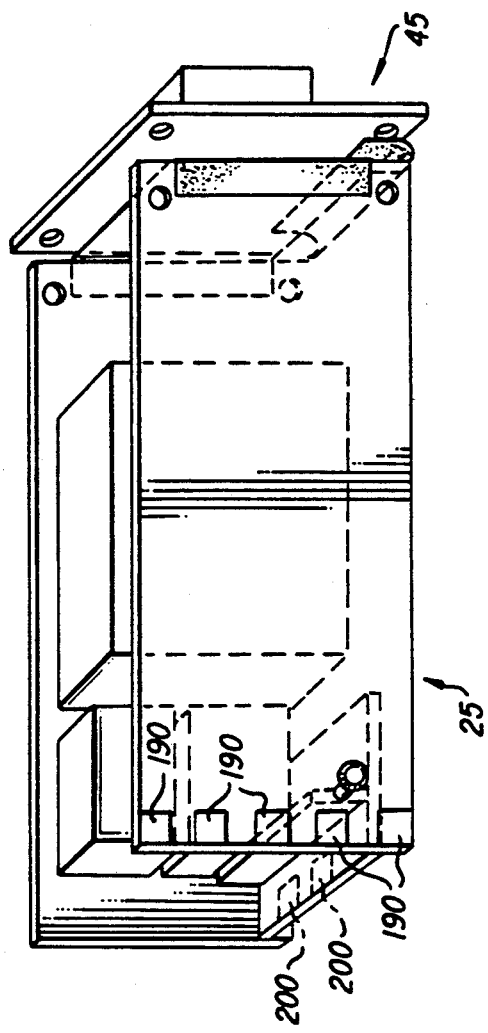
FIG. 7 is a perspective view, in a horizontal orientation, of a substantially assembled single loop controller before attachment of the front panel and the protective housing sleeve (with the printed circuit board clip omitted for clarity).

The elastomeric connector 111 electrically connects the graphic overlay 103 to the display 40, using the four touch screen circuit pads 42, 44, 46, 48, shown in FIG. 18, while the front panel 30 is concurrently structurally attached to the intermediate assembly 25 shown in FIGS. 6 and 7 by four (4) mechanical snaps (not shown), located on the PCB clip 43 which connect into slots 1 14, 116, 118 and 120 on the bezel 105.

Alternatively, in another embodiment preferred for automatic subassembly of the front panel 30, to avoid the 180° rotation of the front panel 30 about axis K—K, the retention lugs 107 and 109 are held in a fixed position (not shown) to align with the lug housings 166 and 168 (not shown), and the bezel 105 is pressed onto the retention lugs 107 and 109 until the retention lugs 107 and 109 are positioned in the lug housings 166 and 168. The elastomeric connector 111 is inserted into the elastomeric connector sleeve 122. The graphic overlay 103 is then adhesively attached to the bezel face 102 after which the nameplate 101 further secures the graphic overlay 103 by the snaps $S_4$ and $S_5$ having ends that snap through and over the top of pillars $P_1$ and $P_2$ to lock the nameplate 101 to the bezel 105.

The touch screen 130 provides the operator/process interface for the temperature controller. Referring to FIGS. 13, 16 and 17 through 20, for a graphic overlay 103, there are shown typical layer configurations consisting of a touch screen 130 comprising a two layer assembly of thin transparent analog panels 140 and 150 which make up the see-through touch switch, also known as the touch screen 130, a top antiglare filter/screen 135, and a backing called a bottom grey mask layer 160. The bottom grey mask layer 160 supports the touch screen and also hides the detail workings of the temperature controller. The antiglare/filter screen 135 and the panels 140 and 150 must be flexible for the touch screen 130 to function properly.

The panels 140 and 150 are enabled as a touch switch by sandwiching small dielectric dots between the two layers 140 and 150 having transparent indium tin oxide ("ITO") deposited on the back surface of the top layer 140 and the front of the bottom layer 150. When touched, the layers 140 and 150 deform, bringing the ITO layers into contact and thereby closing the switch. To reduce glare and enhance the LEDs, the touch screen 130 may be provided with an antiglare filter/screen 135.

In FIGS. 19 and 20 there are shown the analog overlay switch comprising top and bottom panels 140 and 150 having integrally attached silver tracks 141, 143, 151 and 153. Typically, the coordinates of a touch are obtained by first applying a fixed voltage to the top panel 140. The bottom panel 150 then acts as a probe to pick off a voltage from the top panel 140. This sensed voltage will vary relative to the distance along the resistive material 145 or 155 and corresponds to one coordinate. The other coordinate is obtained by reversing these drive and sense functions. The two sensed voltages are then converted to 8 bit digital values, and are used to obtain coordinates which are then compared to the predetermined position of the software configured keys.

Referring to FIG. 17, there is shown a typical active area 161 with its effective coordinate space for the panels 140 and 150. The silver traces of the panels can be covered by a gloss-to-matte accent line 163 which hides the silver traces and defines the active area. The origin of this coordinate space 165 is an imaginary point where the left vertical and lower horizontal components of the inner gloss-to-matte accent line 163 would intersect without a radius.

The protective housing sleeve 70 shown in FIG. 10 is independently assembled by conventional methods. Typically, it is constructed from a molded, high impact plastic. The front of the protective housing sleeve 70 is open for insertion of the intermediate assembly 25, while the rear of the protective housing sleeve 70, shown in this form, is subassembled and consists of two parts (but could be in one or two pieces), that is the sleeve tube 71 and the terminal block 73 (shown subassembled as one piece—the protective housing sleeve 70). It is configured for structural and electrical connection to the terminal connectors 180, 190, and 200 of the PSU 60, PCB 50 and MCB 90. The sides of the protective housing sleeve 70 has ventilation openings 75. The screw inserts 78 (not shown) are heat or ultrasonically welded into the terminal block 73. The spring contacts 79 are inserted into molded partitions in the rear to the terminal block 73. The screw and captive washer 77 then inserted and are are used to trap the external wiring to the system application. Unlike conventional terminal blocks in this size of housing, typically DIN 1/16 and DIN 1/8, because of the functional electronic capability MCB 90, there are provided two more spring contacts 79 which connect to the terminal connectors 200 located on the MCB 90. The intermediate assembly 25 with attached front panel 30 is then inserted into the protective housing sleeve 70 until the retention lugs 107 and 109 mechanically fit into the nests 72 and 74 of the protective housing sleeve 70. For additional structural stability and ease of insertion, the protective housing sleeve 70 may be provided with internal guides for the PCB 50 and PSU 60 along the interior top and bottom of the protective housing sleeve 70.

Although the present invention has been described with respect to exemplary embodiments thereof, it will be understood by those of ordinary skill in the art that variations and modifications can be effected within the scope and spirit of the invention.

What is claimed is:

1. A method of assembly which minimizes soldering requirements for a small electrical device comprising:
   (i) connecting, by means other than soldering, a flexible connector to at least two circuit boards having electrical components fixedly attached, said flexible connector providing electrical connections between said circuit boards;
   (ii) connecting, one of said circuit boards to a display or display element; and
   (iii) assembling said circuit boards into a compact arrangement by flexing the flexible connector;
   (iv) mechanically securing the assembled circuit boards in said compact arrangement;
   (v) connecting, by means other than soldering, a elastomeric connector to one of said circuit boards and electrically connecting said elastomeric connector to a keyboard.

2. A method according to claim 1 wherein at least one of said circuit boards is a three dimensional molded circuit board.

3. A method according to claim 1 wherein the assembled circuit boards are mechanically secured by means of preformed snaps and holes.

4. A method according to claim 1 further comprising connecting a plurality of terminal connector means to said circuit boards for electrical connection to external wiring, wherein said connection is made by first inserting the plurality of terminal connector means into a protective housing sleeve and then inserting said circuit boards into the protective housing sleeve until said circuit boards contact the plurality of terminal connector means.

5. A method of assembly for a small electrical device as claimed in claim 1 wherein said elastomeric connectors are connected to a front panel having a combined display and keyboard.

6. A method according to claim 1 wherein an anisotropic adhesive is used for electrically and structurally connecting the flexible connector to at least two of said circuit boards having electrical components fixedly attached.

7. A method according to claim 6 wherein said anisotropic adhesive is a heat sealing adhesive.

* * * * *